United States Patent
Masuda et al.

(10) Patent No.: US 8,792,792 B2
(45) Date of Patent: *Jul. 29, 2014

(54) LIGHT SOURCE, OPTICAL SIGNAL GENERATOR, AND ELECTRICAL SIGNAL GENERATOR

(75) Inventors: Shin Masuda, Miyagi (JP); Kazunori Shiota, Miyagi (JP)

(73) Assignee: Advantest Corporation, Tokyo (JP)

( * ) Notice: Subject to any disclaimer, the term of this patent is extended or adjusted under 35 U.S.C. 154(b) by 90 days.

This patent is subject to a terminal disclaimer.

(21) Appl. No.: 13/275,336

(22) Filed: Oct. 18, 2011

(65) Prior Publication Data

US 2012/0269521 A1    Oct. 25, 2012

(30) Foreign Application Priority Data

Jan. 11, 2011 (JP) ................................. 2011-003322

(51) Int. Cl.
| | |
|---|---|
| *H04B 10/04* | (2006.01) |
| *H01S 5/042* | (2006.01) |
| *H01S 5/068* | (2006.01) |
| *H01S 3/067* | (2006.01) |
| *H01S 5/00* | (2006.01) |
| *H01S 5/40* | (2006.01) |
| *H01S 3/00* | (2006.01) |

(52) U.S. Cl.
CPC ........... *H01S 5/0427* (2013.01); *H01S 3/06754* (2013.01); *H01S 5/0057* (2013.01); *H01S 5/4006* (2013.01); *H01S 5/06821* (2013.01); *H01S 3/0064* (2013.01)
USPC ........... 398/193; 398/183; 398/194; 398/192; 398/136; 398/196; 398/197; 398/201; 398/158; 398/159; 372/32; 372/34; 372/36; 372/38.02; 359/238; 359/237; 359/245; 359/248

(58) Field of Classification Search
USPC ......... 398/182, 183, 186, 188, 192, 193, 194, 398/195, 196, 197, 198, 200, 201, 158, 159, 398/160, 161, 85, 87; 372/29, 32, 34, 36, 372/38.02; 359/238, 237, 245, 248
See application file for complete search history.

(56) References Cited

U.S. PATENT DOCUMENTS 5,210,807 A * 5/1993 Ames ............................. 385/24
5,771,255 A    6/1998 Horiuchi et al.
(Continued)

FOREIGN PATENT DOCUMENTS

| | | |
|---|---|---|
| EP | 0792033 A2 | 8/1997 |
| JP | H06-196791 A | 7/1994 |

(Continued)

OTHER PUBLICATIONS

Office action issued by the Korean Intellectual Property Office issued on Apr. 15, 2013 for application No. 10-2011-0116519.

(Continued)

*Primary Examiner* — Hanh Phan

(57) ABSTRACT

[PROBLEM] Providing an optical source that outputs optical frequency modulated light having a constant output optical intensity.
[MEANS FOR SOLVING THE PROBLEM] Provided is a light source apparatus that outputs an optical signal having an optical frequency corresponding to a frequency control signal, the light source apparatus including a laser light source section that outputs laser light having an optical frequency corresponding to the frequency control signal; and an optical intensity adjusting section that compensates for intensity change of the laser light to output laser light in which the intensity change caused by a change in the optical frequency is restricted. The optical intensity adjusting section includes an optical amplification section that adjusts an amplification factor of the laser light from the laser light source section, based on the frequency control signal, to restrict the intensity change of laser light corresponding to the frequency control signal, and outputs the resulting laser light.

17 Claims, 6 Drawing Sheets

(56) References Cited

U.S. PATENT DOCUMENTS

| | | | |
|---|---|---|---|
| 5,973,812 A * | 10/1999 | Imai et al. | 398/192 |
| 7,257,330 B2 * | 8/2007 | Lee et al. | 398/183 |
| 8,170,384 B1 * | 5/2012 | Riza | 385/27 |
| 2003/0194240 A1 * | 10/2003 | Mollenauer et al. | 398/158 |
| 2009/0324255 A1 * | 12/2009 | Nakamoto | 398/198 |
| 2011/0206384 A1 * | 8/2011 | Zhou et al. | 398/192 |
| 2012/0177363 A1 * | 7/2012 | Masuda et al. | 398/16 |

FOREIGN PATENT DOCUMENTS

| | | |
|---|---|---|
| JP | H09-232662 A | 9/1997 |
| JP | 2008-151670 A | 7/2008 |

OTHER PUBLICATIONS

Notice of Reasons for Rejection issued by the Japan Patent Office for application No. 2011-003322, Jan. 11, 2011.

* cited by examiner

LIGHT SOURCE, OPTICAL SIGNAL GENERATOR, AND ELECTRICAL SIGNAL GENERATOR

TECHNICAL FIELD

The present invention relates to a light source apparatus, an optical signal generating apparatus, and an electrical signal generating apparatus.

BACKGROUND

A conventionally known technique involves changing optical frequency of output laser light by changing the drive current of a semiconductor laser. When the drive current of the semiconductor laser is changed in this way, the intensity of the output light also changes. Therefore, in order to maintain constant output light, an optical amplifier is provided with a feedback control function to monitor the intensity of the output light and control the amplification factor according to a change in the output light, as shown in Patent Document 1, for example.

Patent Document 1: Japanese Patent Publication Application No. H6-196791

SUMMARY OF THE INVENTION

Problem to be Solved by the Invention

When performing this feedback control, however, a complicated control circuit must be provided. Furthermore, when performing the feedback control with a control circuit, the response speed is limited by the circuit, and modulation of the optical frequency at a high speed exceeding the limitation of the circuit is impossible.

Means for Solving the Problem

So as to solve the above-stated problems, as a first aspect of the present invention herein, provided is a light source apparatus that outputs an optical signal having an optical frequency corresponding to a frequency control signal, the light source apparatus including a laser light source section that outputs laser light having an optical frequency corresponding to the frequency control signal; and an optical intensity adjusting section that compensates for intensity change of the laser light to output laser light in which the intensity change caused by a change in the optical frequency is restricted.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
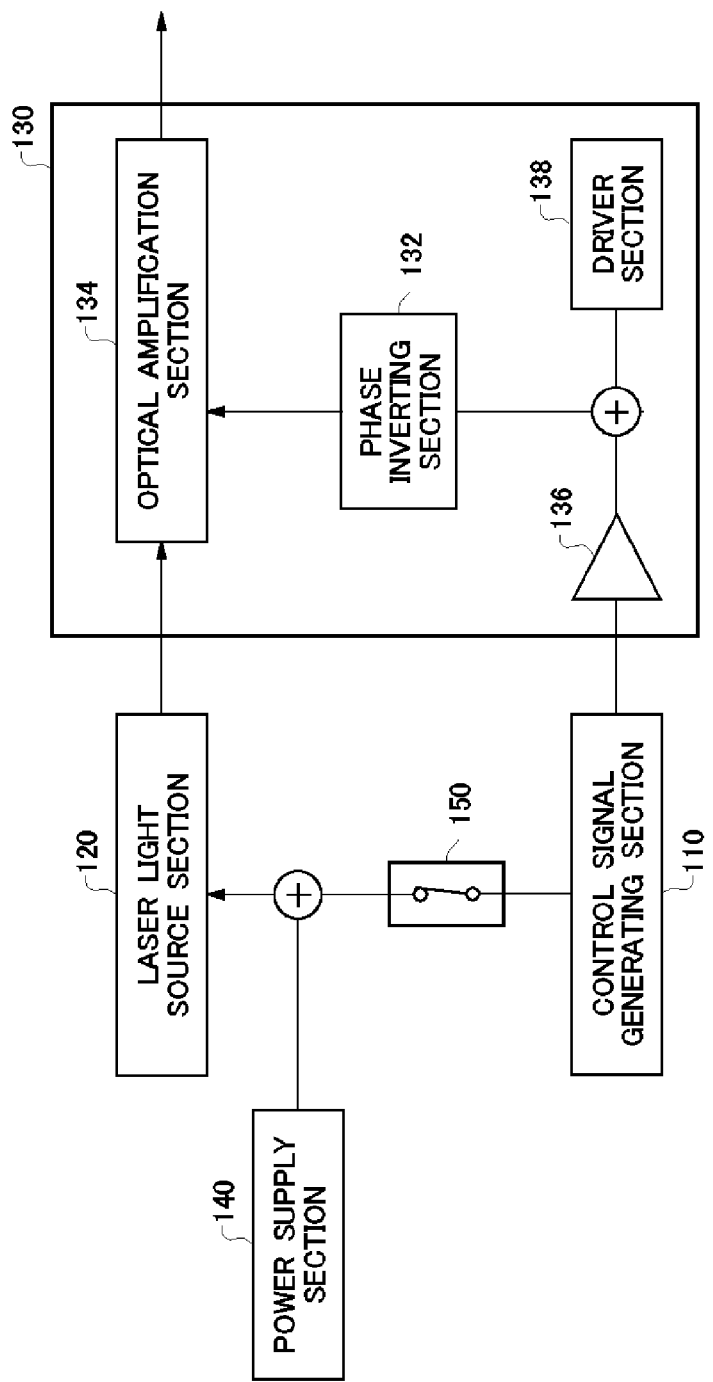
FIG. 1 shows an exemplary configuration of a light source apparatus 100 according to an embodiment of the present invention.

FIG. 1 shows an exemplary configuration of a light source apparatus 100 according to an embodiment of the present invention. The light source apparatus 100 outputs an optical signal having an optical frequency corresponding to a frequency control signal. The light source apparatus 100 outputs an optical signal having a substantially constant output optical intensity. The light source apparatus 100 includes a control signal generating section 110, a laser light source section 120, an optical intensity adjusting section 130, a power supply section 140, and a switching section 150.

The control signal generating section 110 outputs a frequency control signal that changes the drive current for driving the laser light source section 120. The control signal generating section 110 controls the optical frequency of the optical output of the laser light source section 120, by outputting the frequency control signal. The control signal generating section 110 may output the frequency control signal as a periodic signal. For example, the control signal generating section 110 may output a sinusoidal signal as the frequency control signal.

The laser light source section 120 outputs laser light having an optical frequency corresponding to the frequency control signal. The laser light source section 120 may include a semiconductor laser. The laser light source section 120 outputs laser light having an optical frequency corresponding to current input thereto. The laser light source section 120 may include a semiconductor laser having a single oscillation mode. For example, the laser light source section 120 may be a DFB (Distributed FeedBack) laser or a DBR (Distributed Bragg Reflector) laser that includes diffraction grating as a reflective surface of a resonator within the device and efficiently emits a wavelength selected by the diffraction grating to operate in a single longitudinal mode.

The optical intensity adjusting section 130 outputs laser light whose intensity change, which accompanies change in the optical frequency, is restricted by compensating for the intensity change of the laser light. The optical intensity adjusting section 130 includes a phase inverting section 132, an optical amplification section 134, a control signal amplifying section 136, and a driver section 138.

The phase inverting section 132 generates an intensity control signal having an inverse phase of the frequency control signal. The phase inverting section 132 may include a phase shift apparatus that shifts the phase of the frequency control signal input thereto to invert the phase of the frequency control signal. If the frequency control signal generated by the control signal generating section 110 is a periodic signal, the phase inverting section 132 can generate the intensity control signal having the inverse phase of the frequency control signal by shifting the phase of the frequency control signal by substantially half of a cycle, for example. The phase shift apparatus may be a phase adjuster that adjusts the phase of an output electrical signal by changing the electrical length of a transmission line on which the electrical signal is transmitted. As another example, the phase shift apparatus may be a delay circuit.

The phase inverting section 132 may include an inverter circuit that inverts the sign of the frequency control signal input thereto. The phase inverting section 132 can generate the intensity control signal having the inverse phase of the frequency control signal by using the inverter circuit, even if the frequency control signal is not periodic. In this case, the phase inverting section 132 may include a phase shift apparatus, and the phase shift apparatus may make fine adjustments to the phase of the intensity control signal that arrives at the optical amplification section 134.

The optical amplification section 134 adjusts the amplification factor of the laser light from the laser light source section 120 based on the frequency control signal to restrict the intensity change of the laser light according to the frequency control signal, and outputs the resulting laser light. The optical amplification section 134 may decrease the amplification factor of the output light according to an increase in the intensity of the input laser light. The optical amplification section 134 includes an optical amplifier that amplifies the laser light received from the laser light source section by an amplification factor corresponding to the intensity control signal output by the phase inverting section 132, and outputs the amplified laser light. The optical amplifier may be a semiconductor optical amplifier that amplifies by an amplification factor corresponding to current input thereto.

The control signal amplifying section 136 amplifies the frequency control signal generated by the control signal generating section 110. The control signal amplifying section 136 amplifies the frequency control signal such that the phase inverting section 132 outputs an intensity control signal having the signal strength that is to be input to the optical amplification section 134 in order for the optical intensity adjusting section 130 to restrict the intensity change of the laser light from the laser light source section 120, and outputs the amplified frequency control signal to the phase inverting section 132. The control signal amplifying section 136 may amplify the frequency control signal with an amplification factor of one or less. The control signal amplifying section 136 may include an amplifier that amplifies an electrical signal or an attenuator that attenuates an electrical signal.

The driver section 138 outputs a drive current of the optical amplification section 134. The driver section 138 may output a direct current. The optical amplification section 134 receives the intensity control signal obtained by superimposing the amplified frequency control signal output by the control signal amplifying section 136 onto the direct current output by the driver section 138 and inverting the phase of the result using the phase inverting section 132.

The power supply section 140 outputs a drive current for driving the laser light source section 120. The power supply section 140 may output a direct current.

The switching section 150 is provided between the laser light source section 120 and the control signal generating section 110 that outputs the frequency control signal, and switches whether the frequency control signal is supplied to the laser light source section 120. When the switching section 150 is ON, the light source apparatus 100 outputs the optical signal to have an optical frequency corresponding to the frequency control signal and an output optical intensity that is substantially constant. In this case, the laser light source section 120 receives a drive signal obtained by superimposing the frequency control signal output by the control signal generating section 110 onto the drive current output by the power supply section 140, and outputs laser light corresponding to the drive signal.

When the switching section 150 is OFF, the light source apparatus 100 outputs laser light having optical intensity that is changed according to the frequency control signal. In this case, the control signal generating section 110 does not generate a frequency control signal, and therefore the light source apparatus 100 can function as a CW light source with a constant intensity. Furthermore, the light source apparatus 100 can function as an intensity-modulated light source as a result of the control signal generating section 110 outputting a periodic modulated signal as the frequency control signal.

Figure 2:
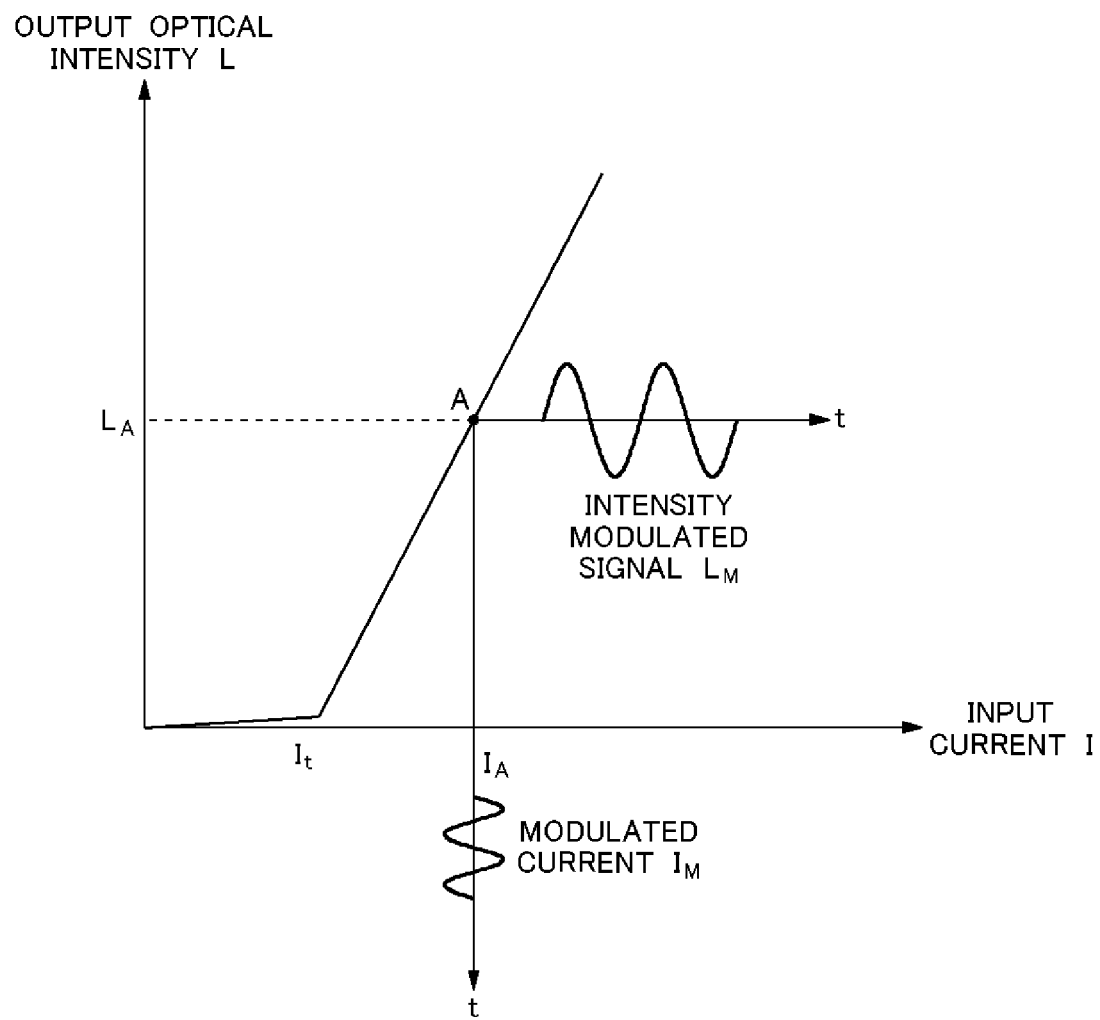
FIG. 2 shows an exemplary characteristic of the output optical intensity L with respect to the input current I of the laser light source section 120, provided in the light source apparatus 100 of the present embodiment.

FIG. 2 shows an exemplary characteristic of the output optical intensity L with respect to the input current I of the laser light source section 120, provided in the light source apparatus 100 of the present embodiment. In FIG. 2, the horizontal axis indicates the current I input to the laser light source section 120, and the vertical axis represents the output optical intensity L of the laser light source section 120.

In the present example, when the input current I exceeds a threshold current $I_t$, the laser light source section 120 performs laser oscillation and outputs laser light. The laser light source section 120 outputs the laser light L having an optical intensity L that is proportional to the input current I.

For example, the power supply section 140 may supply the laser light source section 120 with the drive current $I_A$ having a predetermined constant strength, so that the laser light source section 120 outputs laser light with the optical intensity $L_A$ as shown by point A in FIG. 2. Here, the control signal generating section 110 outputs, as the frequency control signal for controlling the optical frequency, a current signal that changes the drive current $I_A$.

The control signal generating section 110 may output a sinusoidal modulated current $I_M$ and superimpose this current on the drive current $I_A$. In this way, the laser light source section 120 can output laser light whose optical frequency is modulated with a sinusoidal wave. However, by modulating the drive current $I_A$ with the modulated current $I_M$, the laser light source section 120 causes the output optical intensity to also become an intensity modulated signal, such as shown by $L_M$. The light source apparatus 100 of the present embodiment uses the optical intensity adjusting section 130 to compensate for the intensity change in such laser light, thereby restricting the intensity change caused by change in the optical frequency.

Figure 3:
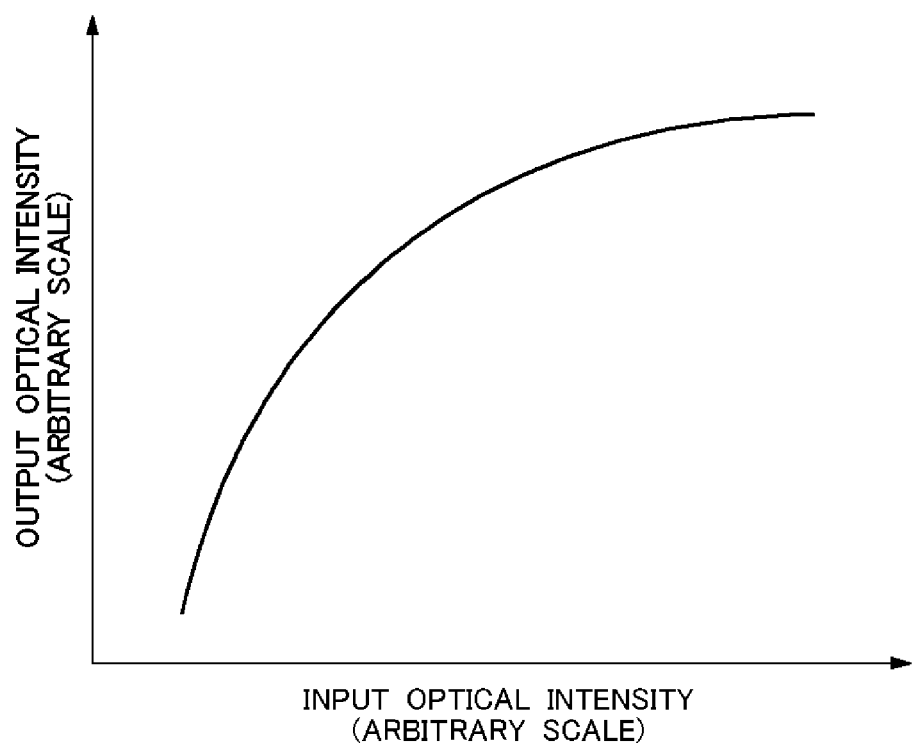
FIG. 3 shows an exemplary characteristic of output optical intensity with respect to input optical intensity of the optical amplification section 134 provided in the light source apparatus 100 according to the present embodiment.

FIG. 3 shows an exemplary characteristic of output optical intensity with respect to input optical intensity of the optical amplification section 134 provided in the optical intensity adjusting section 130 according to the present embodiment. In FIG. 3, the horizontal axis indicates the input optical intensity that is input to the optical amplification section 134, and the vertical axis represents the output optical intensity output by the optical amplification section 134.

The optical amplification section 134 may be a low-saturation semiconductor optical amplifier that decreases the amplification factor of the output light according to an increase in the input optical intensity and saturates the amplification factor. As a result, when the intensity modulated signal $L_M$ is input, the optical amplification section 134 amplifies this signal with an amplification factor corresponding to the amplitude of the optical intensity. In other words, the optical amplification section 134 increases the amplification factor in response to a decrease in the amplitude of the optical intensity and decreases the amplification factor in response to an increase in the amplitude of the optical intensity. As a result, the optical amplification section 134 can restrict the intensity change of the intensity modulated signal $L_M$.

Here, the characteristic of the amplification factor of the low-saturation optical amplifier shown in FIG. 3 is approximately translated on the horizontal axis or vertical axis according to the current input to the optical amplification section 134. For example, the optical amplification section 134 increases the input optical intensity that causes the amplification factor to be saturated according to an increase of the input current, and therefore the amplification factor characteristic moves in the positive direction on the horizontal axis. In this case, the optical amplification section 134 increases the optical saturated output intensity according to an increase of the input current, and therefore the amplification factor characteristic moves in the positive direction on the vertical axis.

The optical amplification section 134 decreases the input optical intensity that causes the amplification factor to be saturated according to a decrease of the input current, and therefore the amplification factor characteristic moves in the negative direction on the horizontal axis. In this case, the optical amplification section 134 decreases the saturated optical output according to a decrease of the input current, and therefore the amplification factor characteristic moves in the negative direction on the vertical axis. Accordingly, when the intensity modulated signal $L_M$ is input, the driver section 138 supplies the optical amplification section 134 with an input voltage that causes the optical amplification section 134 to function as a low-saturation amplifier.

When the optical amplification section 134 does not sufficiently fulfill the function of a low-saturation optical amplifier, or when the input optical intensity is not large enough for the optical amplification section 134 to exhibit the saturation effect, so that the restriction of the intensity change is insufficient, the light source apparatus 100 may control the input current of the optical amplification section 134 in a manner to cancel out the intensity change of the input light.

As described in relation to FIG. 2, the intensity change of the input light of the optical amplification section 134 occurs according to the frequency control signal. Accordingly, the optical amplification section 134 can restrict the intensity change caused by change in the optical frequency by changing the amplification factor for the input light, whose optical intensity changes according to the frequency control signal, at timings at an inverse phase of the frequency control signal.

Therefore, the light source apparatus 100 inverts the phase of the frequency control signal output from the control signal generating section 110 using the phase inverting section 132, superimposes the resulting signal on the drive current of the optical amplification section 134 output from the driver section 138, and supplies the resulting signal to the optical amplification section 134 as the intensity control signal. Here, the phase inverting section 132 adjusts the timing at which the intensity control signal reaches the optical amplification section 134 such that the amplification factor of the optical amplification section 134 increases when the optical intensity of the input light decreases according to the frequency control signal and the amplification factor of the optical amplification section 134 decreases when the optical intensity of the input light increases according to the frequency control signal, and supplies the intensity control signal to the optical amplification section 134 at the adjusted timings.

The control signal amplifying section 136 causes the phase inverting section 132 to output the amplitude intensity of the intensity control signal for controlling the amplification factor of the optical amplification section 134 such that the output light of the optical amplification section 134 has a substantially constant optical intensity. For example, the light source apparatus 100 may measure in advance the output light from the optical amplification section 134 and adjust in advance the amplification factor of the frequency control signal used by the control signal amplifying section 136 to achieve constant output light for the optical amplification section 134.

The light source apparatus 100 according to the present embodiment described above can output laser light in which the intensity change caused by a change in the optical frequency is restricted, by causing the optical amplification section 134 to function as a low-saturation amplifier and/or changing the amplification factor of the optical amplification section 134 according to the intensity change of the input light. In this way, the light source apparatus 100 can output an optical signal having substantially constant optical intensity while changing the optical frequency according to the frequency control signal.

Furthermore, the light source apparatus 100 can keep the optical intensity substantially constant without using a complicated feedback circuit. Accordingly, the light source apparatus 100 does not have the limitations of a feedback circuit, and can change the optical frequency with high speed.

The light source apparatus 100 can function as a CW light source by turning OFF the switching section 150. Furthermore, the light source apparatus 100 can function as an intensity modulated light source by turning OFF the switching section 150 and outputting the frequency control signal of the control signal generating section 110 as a periodic modulated signal.

The control signal amplifying section 136 may output a frequency control signal having a signal strength greater than that of the control signal to be input to the optical amplification section 134, in order to cause the optical intensity adjusting section 130 to restrict the intensity change of the laser light form the laser light source section 120. As a result of the light source apparatus 100 outputting the frequency control signal of the control signal generating section 110 as a periodic modulated signal, the optical amplification section 134 amplifies the input light with an amplification factor that is high enough to not only restrict the intensity change caused by modulation of the optical frequency, but to also modulate the input light. In this way, while modulating the optical frequency, the light source apparatus 100 can output an optical signal in which the optical intensity is modulated with a frequency that is the same as that of the modulated signal and a modulation strength that is different from that of the optical frequency.

Figure 4:
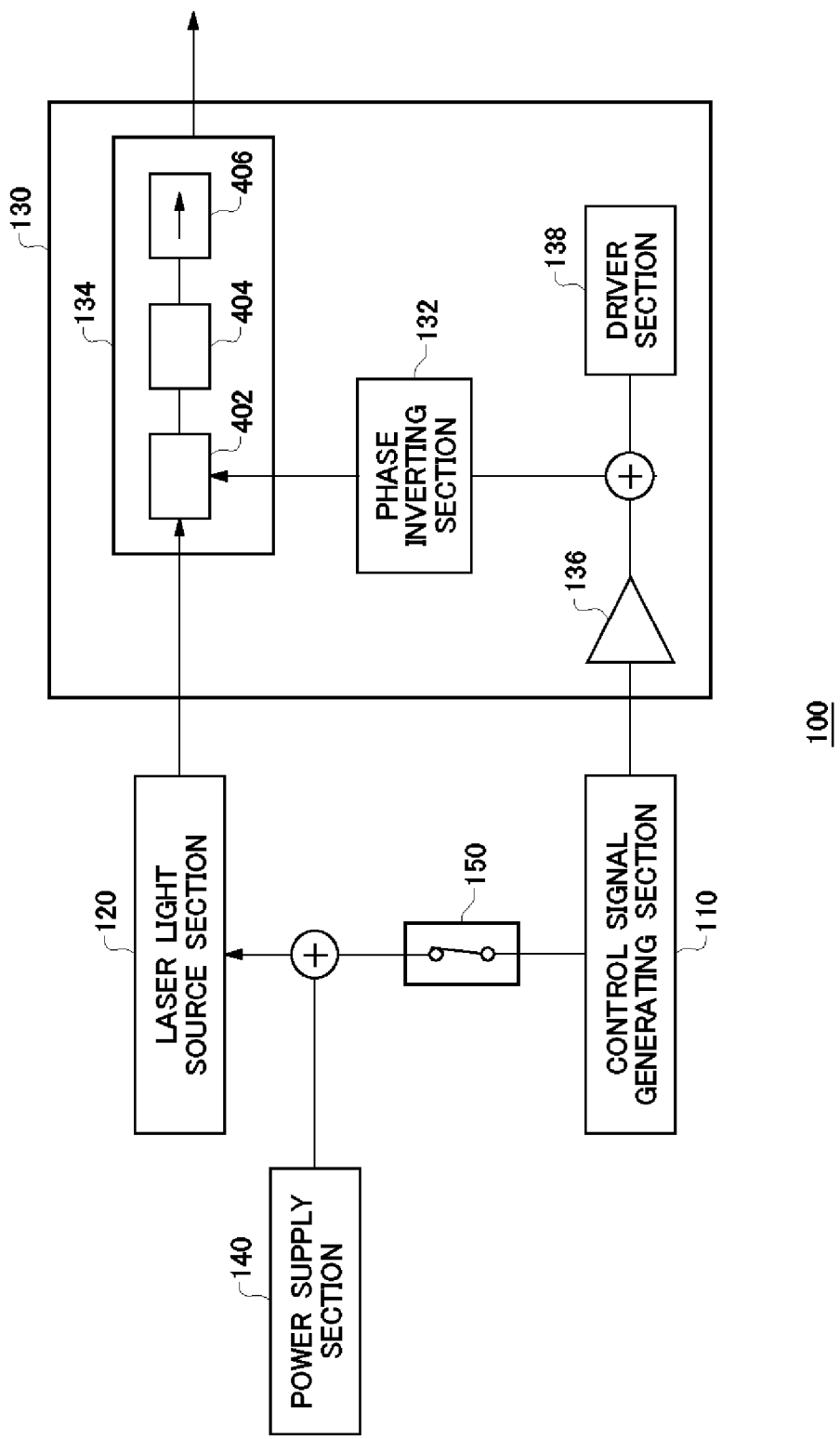
FIG. 4 shows a modification of the light source apparatus 100 according to the present embodiment.

FIG. 4 shows a modification of the light source apparatus 100 according to the present embodiment. In the present modification, components that are substantially the same as those in the light source apparatus 100 of the present embodiment shown in FIG. 1 are given the same reference numerals, and descriptions thereof are omitted. The optical amplification section 134 of the light source apparatus 100 of the present modification includes a first optical amplifier 402, a second optical amplifier 404, and an optical isolator 406.

The first optical amplifier 402 may be a semiconductor optical amplifier that amplifies with an amplification factor corresponding to current input thereto. The first optical amplifier 402 is substantially the same as the optical amplifier of the optical amplification section 134 in the light source apparatus 100 according to the embodiment described in relation to FIG. 1, and therefore no description thereof is provided.

The second optical amplifier 404 may be an optical fiber amplifier that decreases the amplification factor of output light according to an increase in the intensity of input laser light. For example, an optical fiber amplifier having optical fiber doped with rare earth elements, for example, may have a saturation characteristic that decreases the amplification factor according to an increase in the input light, as described in relation to FIG. 3. The saturation characteristic of the optical fiber amplifier is approximately translated on the vertical axis or the horizontal axis, as shown in FIG. 3, by adjusting the length of the rare-earth-doped optical fiber or the optical intensity of excitation light for exciting the rare-earth-doped optical fiber.

The second optical amplifier 404 having such a configuration decreases the optical intensity of the input light that saturates the amplification factor, by decreasing the length of the rare-earth-doped fiber or increasing the length of the rare-earth-doped fiber to be great enough that the amplified light obtained by amplifying the input light absorbs and attenuates itself. Therefore, the amplification factor characteristic moves in the negative direction on the horizontal axis. In this case, the optical fiber amplifying section decreases the saturated output optical intensity, and therefore the amplification characteristic moves in the negative direction on the vertical axis.

The second optical amplifier 404 decreases the input optical intensity that causes saturation of the amplification factor according to a decrease of the excitation light intensity, and therefore the amplification factor characteristic moves in the negative direction on the horizontal axis. In this case, the optical fiber amplifying section also decreases the saturated output optical intensity, and therefore the amplification factor characteristic moves in the negative direction on the vertical axis.

The second optical amplifier 404 increases the input optical intensity that causes saturation of the amplification factor according to an increase of the excitation light intensity, and therefore the amplification factor characteristic moves in the positive direction on the horizontal axis. In this case, the optical fiber amplifier also increases the saturated output optical intensity, and therefore the amplification factor characteristic moves in the positive direction on the vertical axis.

Accordingly, the light source apparatus 100 may set in advance an optical intensity for the excitation light that excites the rare-earth-doped fiber and a length of the rare-earth-doped fiber that cause the second optical amplifier 404 to function as a low-saturation amplifier for the intensity modulated signal $L_M$ input thereto. As a result, when the first optical amplifier 402 cannot restrict the intensity change caused by a change in the optical frequency, the second optical amplifier 404 can restrict the intensity change of the laser light output by the first optical amplifier 402 and output the resulting laser light.

The optical isolator 406 is connected downstream from the optical fiber amplifier, which is the second optical amplifier 404, outputs light received at an input terminal thereof from an output terminal thereof, and attenuates the light that is input to the output end thereof to prevent light from being output to the input end. The optical isolator 406 propagates light input thereto in the output direction, and blocks return light that is reflected during propagation. Therefore, the optical isolator 406 can prevent reflected light from being input to the second optical amplifier 404. Depending on the intensity and wavelength of the reflected light, the reflected light might excite the rare-earth-doped optical fiber of the second optical amplifier 404. Therefore, by blocking this reflected light, the optical isolator 406 enables the amplification function of the second optical amplifier 404 to operate stably.

In the modification described above, the light source apparatus 100 can output laser light in which the intensity change caused by a change in the optical frequency is restricted, due to the inclusion of a plurality of optical amplifiers. In the present modification, the light source apparatus 100 includes one first optical amplifier 402 and one second optical amplifier 404. Instead, the light source apparatus 100 may include a plurality of second optical amplifiers 404.

In this way, even when the modulation amplitude of the optical frequency increases greatly and causes a large intensity change, the light source apparatus 100 of the present modification can output laser light in which the intensity change caused by a change in the optical frequency is restricted by using the low-saturation characteristics of a plurality of optical amplifiers. Furthermore, the light source apparatus 100 may restrict the intensity change caused by a change in the optical frequency by including a plurality of the second optical amplifiers 404 but no first optical amplifiers 402.

Figure 5:
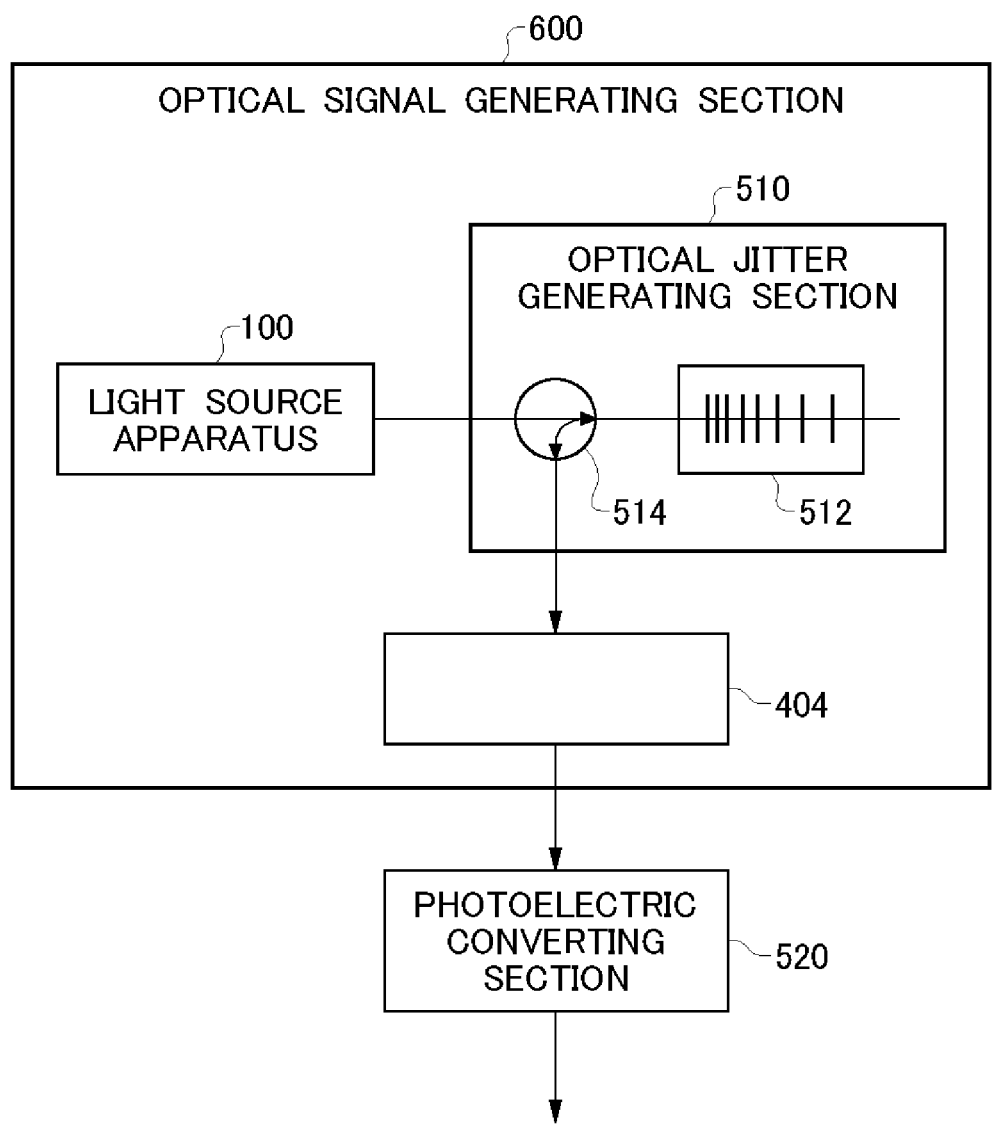
FIG. 5 shows an exemplary configuration of an electrical signal generating apparatus 700 including a photoelectric converter 520 and an optical signal generating apparatus 600, according to the present embodiment.

FIG. 5 shows an exemplary configuration of an electrical signal generating apparatus 700 including a photoelectric converter 520 and an optical signal generating apparatus 600, according to the present embodiment. The optical signal generating apparatus 600 creates jitter in an optical signal and outputs the resulting signal. The electrical signal generating apparatus 700 generates an electrical signal on which jitter is superimposed. The optical signal generating apparatus 600 includes the light source apparatus 100 and an optical jitter generating section 510. The light source apparatus 100 may be substantially the same as the light source apparatus 100 according to the present embodiment, which outputs an optical signal having an optical frequency corresponding to a frequency control signal, and therefore a description of this light source apparatus 100 is omitted.

The optical jitter generating section 510 delays the optical signal output by the light source apparatus 100, according to the optical frequency of the optical signal, and applies jitter corresponding to the optical frequency to the optical signal. The optical jitter generating section 510 includes a grating section 512 and an optical circulator 514.

The grating section 512 includes diffraction grating having a refractive index that periodically changes in a direction in which the light progresses. The grating section 512 may be a fiber Bragg grating. The grating section 512 applies different delay amounts to the input light input from an input end thereof, according to the optical frequency of the input light, and returns the delayed light to the input end thereof. The grating section 512 may include a plurality of fiber gratings formed at different positions in the longitudinal direction.

The grating section 512 includes a plurality of gratings at uniform intervals, thereby forming a Bragg grating. The Bragg grating reflects light in a narrow band centered on the Bragg wavelength, which is obtained as double the product of the refractive index of the optical fiber and the period of the grating. In other words, each fiber grating of the grating section 512 reflects light of a unique wavelength, i.e. optical frequency.

The distance from the input end of the grating section 512 to each fiber grating is different, and therefore the length of the optical path from when light is input at the input end to when the light is returned to be input again at the input end is different according to the optical frequency of the input light.

Accordingly, the grating section 512 can apply jitter corresponding to the optical frequency to the optical signal by applying a delay corresponding to the optical frequency of the input optical signal.

Instead, the grating section 512 may be a CFBG (Chirped Fiber Bragg Grating) in which the period of the gratings changes. A CFBG changes the reflection position within the fiber according to the frequency of the light and outputs the resulting light, and therefore the CFBG can apply jitter corresponding to the optical frequency to the optical signal by applying a delay corresponding to the optical frequency of the input optical signal.

The optical circulator 514 inputs the optical signal output from the light source apparatus 100 into the input end of the grating section 512, receives the optical signal to which the jitter is applied output from the input end of the grating section 512, and outputs this received optical signal to the outside as the output light.

The optical signal generating apparatus 600 described above can apply jitter corresponding to the frequency control signal to the optical signal output by the light source apparatus 100, and output the resulting signal. Furthermore, the light source apparatus 100 can modulate the optical frequency without the band limitation of a feedback circuit, and therefore the optical signal generating apparatus 600 can generate jitter without this limitation.

The optical signal generating apparatus 600 described in the example above includes a plurality of fiber gratings as the optical jitter generating section 510. Instead, the optical jitter generating section 510 may include a dispersive medium having a frequency dispersion value that continuously changes. The optical jitter generating section 510 may be optical fiber having a frequency dispersion value that continuously changes. Such optical fiber causes a delay corresponding to the optical frequency of the optical signal input to the input end thereof, and outputs the delayed optical signal from the output end. Accordingly, in this case, the optical signal generating apparatus 600 outputs the output light from the output end of the optical fiber to the outside without using the optical circulator 514.

Instead, the optical jitter generating section 510 may include an arrayed web guide (AWG) that has a plurality of guide paths with different lengths and changes the guide path on which the input light is transmitted according to the optical frequency of the input light. The optical jitter generating section 510 can apply jitter corresponding to the optical frequency, by transmitting the input light on guide paths with different lengths according to the input optical frequency, and output the resulting light.

The light source apparatus 100 of the optical signal generating apparatus 600 may include a plurality of optical amplifiers to output laser light in which the intensity change caused by a change in the optical frequency is restricted. The optical signal generating apparatus 600 may connect the second optical amplifier 404 to the output of the optical jitter generating section 510 to laser light in which the intensity change caused by a change in the optical frequency is restricted.

The electrical signal generating apparatus 700 includes the photoelectric converter 520 and the optical signal generating apparatus 600 that generates jitter in the optical signal and outputs the resulting optical signal. The photoelectric converter 520 converts the optical signal output by the optical signal generating apparatus 600 into an electrical signal. The photoelectric converter 520 may include a feedback diode. The electrical signal generating apparatus 700 can convert the optical signal including optical jitter generated by the optical signal generating apparatus 600 into an electrical signal, thereby outputting an electrical signal including jitter.

The electrical signal generating apparatus 700 can generate jitter without the band limitation imposed by a feedback circuit, for example, in the same manner as the optical signal generating apparatus 600. When causing the light source apparatus 100 to generate a periodic frequency control signal, the electrical signal generating apparatus 700 and the optical signal generating apparatus 600 can generate jitter corresponding to one cycle of the periodic signal, apply this jitter to the optical signal, and output the result as an optical signal or an electrical signal.

Figure 6:
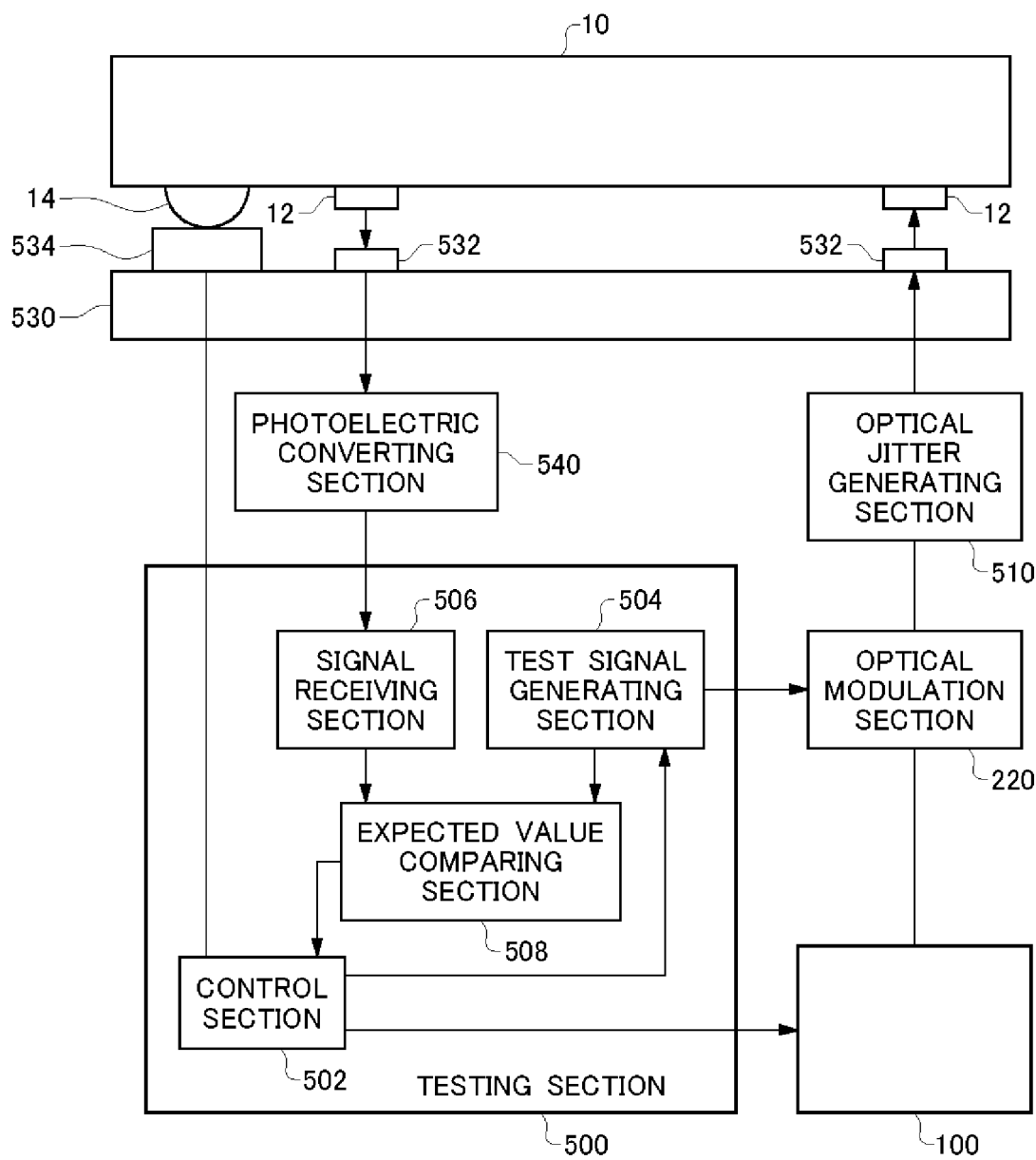
FIG. 6 shows an exemplary configuration of a test apparatus 1000 according to the present embodiment, along with a device under test 10.

FIG. 6 shows an exemplary configuration of a test apparatus 1000 according to the present embodiment, along with a device under test 10. In the present embodiment, components that are substantially the same as those in the light source apparatus 100 and the optical signal generating apparatus 600 described in FIGS. 1 to 5 are given the same reference numerals and description thereof is omitted. The test apparatus 1000 tests a device under test 10 having an optical interface, and the device under test 10 may be an analog circuit, a digital circuit, a memory, or a system on chip (SOC), for example.

The device under test 10 may be a circuit resulting from a combination of an optical interface and at least one of an analog circuit, a digital circuit, a memory, and a system on chip (SOC), for example. The device under test 10 includes one or more optical input/output sections 12 that exchange optical signals. The device under test 10 may also include one or more input/output terminals 14 that exchange optical signals. The input/output terminal 14 may be a solder bump, a land, or a connector, for example.

The test apparatus 1000 supplies the optical input/output section 12 of the device under test 10 with an optical test signal, receives an electrical response signal resulting from the photoelectric conversion of an optical response signal output from the optical input/output section 12 of the device under test 10, and judges pass/fail of the device under test 10 by comparing the electrical response signal to an expected value. The test apparatus 1000 may supply the input/output terminal 14 of the device under test 10 with a control signal that controls the supply of power to the device under test 10 or the starting and stopping of the testing, for example. The test apparatus 1000 includes the light source apparatus 100, an optical modulation section 220, a testing section 500, an optical jitter generating section 510, an optical interface 530, and a photoelectric converter 540.

The light source apparatus 100 outputs laser light in which the intensity change caused by a change in the optical frequency is restricted. The light source apparatus 100 may output the laser light to the optical modulation section 220 according to a test start signal of the testing section 500, and may stop the supply of the laser light according to a test stop signal of the testing section 500.

The optical modulation section 220 receives a test signal from the testing section 500, and modulates the laser light, in which the intensity change caused by a change in the optical frequency is restricted, from the light source apparatus 100 according to the test signal. The optical modulation section 220 may receive a pulse pattern signal as the test signal, and output an optical pulse pattern by modulating the laser light. The optical modulation section 220 may be an optical modulator formed using a ferroelectric crystal such as $LiNbO_3$ (lithium niobate) or material in the PbLaZrTiO family, such as PLZT (lead lanthanum zirconate titanate).

The optical jitter generating section 510 applies jitter corresponding to the optical frequency of the optical pulse pattern signal to the optical pulse pattern signal received from the optical modulation section 220, and outputs the resulting signal. The optical jitter generating section 510 transmits the optical pulse pattern signal to which the jitter is applied to the optical interface 530.

The device under test 10 is mounted on the optical interface 530. For example, the device under test 10 may be fixed to the optical interface 530 via adhesion. The optical interface 530 transmits the optical pulse pattern signal, which is received as the optical test signal, to the optical input/output section 12 of the device under test 10. The device under test 10 receives and outputs the optical response signal output from the optical input/output section 12.

The optical interface 530 may include a number of optical input/output sections 532 greater than or equal to the number of optical input/output sections 12 of the device under test 10. The optical interface 530 may further include a number of input/output terminals 534 greater than or equal to the number of input/output terminals 14 of the device under test 10, if testing is performed by exchanging electrical signals with the device under test 10.

The optical input/output section 532 exchanges optical signals with the device under test 10. The optical input/output section 532 may output the optical signal as a light beam that propagates through space, using a lens, a prism, and/or a half mirror, for example. Instead, the optical input/output section 532 may pass an optical signal by arranging the output end of the optical transmission path near the optical input/output section 12 of the device under test 10 or in contact with the optical input/output section 12.

The optical input/output section 532 may include a collimating lens at the output end of the optical transmission path to exchange optical signals with the optical input/output section 12 of the device under test 10. If the optical input/output section 12 is a connector, the optical input/output section 532 may be a connector that engages with the optical input/output section 12.

The input/output terminal 534 is electrically connected to the input/output terminal 14 of the device under test 10 and exchanges electrical signals with the input/output terminal 14. The input/output terminal 534 may supply the device under test 10 with a clock having a low frequency relative to the optical test signal, a control signal indicating start, stop, or interrupt of testing, and/or a power supply.

The input/output terminal 534 may be a probe, a cantilever, a membrane bump, or a terminal directly contacting the input/output terminal 14 of the device under test 10, for example. If the input/output terminal 14 is a connector, the input/output terminal 534 may be a connector that engages with the input/output terminal 14.

The photoelectric converter 540 converts the optical response signal output by the optical interface 530 into an electrical response signal, and transmits the response signal to the testing section 500. For example, the photoelectric converter 540 may convert the optical response signal into the response signal using a photodiode. Instead, the photoelectric converter 540 may be an image sensor such as a CCD. In this ease, the photoelectric converter 540 may receive a plurality of optical response signals via a plurality of optical transmission paths, and convert the optical response signals into a plurality of response signals.

The testing section 500 outputs the test signal, receives the response signal corresponding to the test signal, and compares the response signal to an expected value. For example, the testing section 500 may acquire a test program used for testing from an external computer, such as a work station, or storage apparatus, or acquire a test program that is input by a user, and output the test signal by executing this program. The testing section 500 includes a control section 502, a test signal generating section 504, a signal receiving section 506, and an expected value comparing section 508.

The control section 502 executes the test program by transmitting a control signal indicating the operational timing of the apparatuses of the test apparatus 1000. The control section 502 may receive the test results and display the test results to the user, or may transmit the test results to be stored in an external computer or storage apparatus.

The test signal generating section 504 generates a test signal for testing the device under test 10. The test signal generating section 504 generates the test signal to be used for the optical signal test based on test pattern data or a test sequence designated by the test program, for example. The test signal generating section 504 may generate a pulse pattern signal and transmit the pulse pattern signal to the optical modulation section 220, for example. The test signal generating section 504 may generate the expected value of the response signal output by the device under test 10 in response to the test signal, and transmit the expected value to the expected value comparing section 508.

The signal receiving section 506 receives an electrical signal resulting from the conversion of the optical response signal output by the device under test. The signal receiving section 506 transmits the received signal to the expected value comparing section 508.

The expected value comparing section 508 compares the signal received by the signal receiving section 506 to the expected value. The expected value comparing section 508 receives the expected value from the test signal generating section 504. The control section 502 may judge pass/fail of the device under test 10 based on the comparison result of the expected value comparing section 508.

The test apparatus 1000 of the present modification described above can perform optical testing by transmitting an optical test signal to which jitter has been applied to a device under test including an optical input/output section 12 and receiving a response signal corresponding to the optical test signal. Furthermore, the test apparatus 1000 can perform this optical testing by combining the testing section 500 that performs testing using electrical signals with a light source apparatus 100, an optical modulation section 220, an optical jitter generating section 510, and an optical interface 530.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF THE NUMERALS 10 device under test
12 optical input/output sections
14 input/output terminals 100 light source apparatus
110 control signal generating section
120 laser light source section
130 optical intensity adjusting section
132 phase inverting section
134 optical amplification section
136 control signal amplifying section
138 driver section
140 power supply section
150 switching section
220 optical modulation section
402 first optical amplifier
404 second optical amplifier
406 optical isolator
500 testing section
502 control section
504 test signal generating section
506 signal receiving section
508 expected value comparing section
510 optical jitter generating section
512 grating section
514 optical circulator
520 photoelectric converter
530 optical interface
532 optical input/output sections
534 input/output terminals
540 photoelectric converter
600 optical signal generating apparatus
700 electrical signal generating apparatus
1000 test apparatus.

What is claimed is:

1. A light source apparatus that outputs an optical signal having an optical frequency corresponding to a frequency control signal, the light source apparatus comprising:
   a control signal generating section that outputs the frequency control signal;
   a laser light source section that outputs laser light having an optical frequency corresponding to the frequency control signal;
   an optical intensity adjusting section that compensates for intensity change of the laser light to output laser light in which the intensity change caused by a change in the optical frequency is restricted; and
   a switching section that is provided between the laser light source section and the control signal generating section, and that switches whether the frequency control signal is supplied to the laser light source section.

2. The light source apparatus according to claim 1, wherein the optical intensity adjusting section includes an optical amplification section that adjusts an amplification factor of the laser light from the laser light source section, based on the frequency control signal, to restrict the intensity change of laser light corresponding to the frequency control signal, and outputs the resulting laser light.

3. The light source apparatus according to claim 2, wherein the optical intensity adjusting section includes a phase inverting section that generates an intensity control signal having a phase that is an inverse of a phase of the frequency control signal, and
   the optical amplification section includes an optical amplifier that amplifies the laser light received from the laser light source section with an amplification factor corresponding to the intensity control signal, and outputs the amplified laser light.

4. The light source apparatus according to claim 3, wherein the optical amplifier is a semiconductor optical amplifier that performs amplification with an amplification factor corresponding to current input thereto.

5. The light source apparatus according to claim 4, wherein the optical amplifier decreases the amplification factor of output light according to an increase in intensity of input laser light.

6. The light source apparatus according to claim 3, wherein the phase inverting section includes a phase shift apparatus that inverts the phase of the frequency control signal input thereto by shifting the phase of the frequency control signal.

7. The light source apparatus according to claim 6, wherein the phase inverting section further includes an inverter circuit that inverts a sign of the frequency control signal input thereto.

8. The light source apparatus according to claim 3, wherein the phase inverting section further includes a control signal amplifying section that amplifies the frequency control signal, and
   the control signal amplifying section outputs a frequency control signal having a signal strength of a control signal to be input to the optical amplification section, so that the optical intensity adjusting section restricts intensity change of the laser light from the laser light source section.

9. The light source apparatus according to claim 2, wherein the optical amplification section includes an optical fiber amplifier that decreases the amplification factor of output light according to an increase of intensity of input laser light.

10. The light source apparatus according to claim 9, further comprising an optical isolator that is connected downstream from the optical fiber amplifier, outputs from an output end thereof light input to an input end thereof, and prevents output of light to the input end by attenuating light input from the output end.

11. The light source apparatus according to claim 9, wherein
    the optical fiber amplifier includes a rare-earth-doped fiber with a predetermined length.

12. The light source apparatus according to claim 1, wherein
    the laser light source section includes a semiconductor laser, and the frequency control signal changes drive current for driving the semiconductor laser.

13. An optical signal generating apparatus that generates jitter in an optical signal and outputs the resulting optical signal, the optical signal generating apparatus comprising:
    the light source apparatus according to claim 1 that outputs the optical signal having the optical frequency corresponding to the frequency control signal; and
    an optical jitter generating section that delays the optical signal output by the light source apparatus according to the optical frequency of the optical signal, to apply jitter corresponding to the optical frequency to the optical signal.

14. The optical signal generating apparatus according to claim 13, wherein
    the jitter generating section includes a diffraction grating having a refractive index that periodically changes in a direction in which light proceeds.

15. The optical signal generating apparatus according to claim 14, wherein
the jitter generating section includes a fiber Bragg grating.

16. The optical signal generating apparatus according to claim 13, wherein
the jitter generating section includes a dispersive medium having a frequency dispersion value that changes continuously.

17. An electrical signal generating apparatus that generates an electrical signal on which jitter is superimposed, the electrical signal generating apparatus comprising:
the optical signal generating apparatus according to claim 13 that generates jitter in an optical signal and outputs the resulting optical signal; and
a photoelectric converter that converts the optical signal output by the optical signal generating apparatus into an electrical signal.

* * * * *